(12) United States Patent
Sung et al.

(10) Patent No.: US 10,964,578 B2
(45) Date of Patent: Mar. 30, 2021

(54) APPARATUS FOR MANUFACTURING SEMICONDUCTOR DEVICE AND MANUFACTURING METHOD OF SEMICONDUCTOR DEVICE

(71) Applicant: Samsung Electronics Co., Ltd., Suwon-si (KR)

(72) Inventors: Jung Mo Sung, Seoul (KR); Jong Woo Sun, Hwaseong-si (KR); Je Woo Han, Hwaseong-si (KR); Chan Hoon Park, Osan-si (KR); Seung Yoon Song, Seoul (KR); Seul Ha Myung, Incheon (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 196 days.

(21) Appl. No.: 16/401,792

(22) Filed: May 2, 2019

(65) Prior Publication Data
US 2020/0135527 A1 Apr. 30, 2020

(30) Foreign Application Priority Data
Oct. 30, 2018 (KR) .................. 10-2018-0130882

(51) Int. Cl.
*H01L 21/683* (2006.01)
*H01L 21/67* (2006.01)

(52) U.S. Cl.
CPC .... *H01L 21/6833* (2013.01); *H01L 21/67069* (2013.01); *H01L 21/67213* (2013.01)

(58) Field of Classification Search
CPC ........... H01L 21/6833; H01L 21/67213; H01L 21/67069
See application file for complete search history.

(56) References Cited

U.S. PATENT DOCUMENTS

| | | | |
|---|---|---|---|
| 6,475,336 B1 | 11/2002 | Hubacek | |
| 9,704,690 B2* | 7/2017 | Kim | H01J 37/321 |
| 9,887,069 B2 | 2/2018 | Fischer et al. | |
| 10,002,744 B2 | 6/2018 | Chen et al. | |
| 2005/0211546 A1* | 9/2005 | Hanawa | H01J 37/32449 |
| | | | 204/192.12 |
| 2016/0379805 A1 | 12/2016 | Koshiishi et al. | |
| 2018/0032100 A1* | 2/2018 | Kim | H01J 37/321 |
| 2018/0182600 A1 | 6/2018 | Sohn et al. | |

FOREIGN PATENT DOCUMENTS

KR  10-2008-0060763 A  7/2008

* cited by examiner

*Primary Examiner* — Adolf D Berhane
*Assistant Examiner* — Afework S Demisse
(74) *Attorney, Agent, or Firm* — Muir Patent Law, PLLC

(57) ABSTRACT

A semiconductor processing apparatus includes a chamber housing, an electrostatic chuck disposed in the chamber housing, the electrostatic chuck being configured to hold a semiconductor wafer, an edge ring surrounding the electrostatic chuck, the edge ring including a ring electrode disposed within the edge ring, and a ring voltage supply configured to supply a ring voltage to the ring electrode, the ring voltage having a non-sinusoidal periodic waveform, wherein each period of the non-sinusoidal periodic waveform comprises a positive voltage applied during a first time period and a negative voltage applied during a second time period, and wherein the negative voltage has a magnitude that increases during the second time period.

20 Claims, 11 Drawing Sheets

APPARATUS FOR MANUFACTURING SEMICONDUCTOR DEVICE AND MANUFACTURING METHOD OF SEMICONDUCTOR DEVICE

CROSS-REFERENCE TO RELATED APPLICATION(S)

This application claims priority under 35 U.S.C. § 119 to Korean Patent Application No. 10-2018-0130882 filed on Oct. 30, 2018 in the Korean Intellectual Property Office, the disclosure of which is incorporated herein by reference in its entirety.

BACKGROUND

1. Field

The present inventive concept relates to an apparatus for manufacturing a semiconductor device and a manufacturing method of a semiconductor device.

2. Description of Related Art

A semiconductor device may be manufactured by various semiconductor processes. Chambers for performing semiconductor processes may include a chamber in which plasma is forcibly generated. As an example, an etching process may be performed to remove a portion of a wafer or some layers disposed on the wafer. When a semiconductor process using plasma is performed, radicals and ions may be formed in a chamber. The radicals and the ions may be formed by bias power supplied to the chamber.

SUMMARY

An aspect of the present inventive concept is to provide a semiconductor processing apparatus, in which a semiconductor manufacturing process using plasma is performed and plasma sheath is controlled to efficiently perform a semiconductor manufacturing process, and a manufacturing method of a semiconductor device.

According to an aspect of the present inventive concept, a semiconductor processing apparatus includes a chamber housing, an electrostatic chuck disposed in the chamber housing, the electrostatic chuck being configured to hold a semiconductor wafer, an edge ring surrounding the electrostatic chuck, the edge ring including a ring electrode disposed within the edge ring, and a ring voltage supply configured to supply a ring voltage to the ring electrode, the ring electrode having a non-sinusoidal periodic waveform, wherein each period of the non-sinusoidal waveform comprises a positive voltage applied during a first time period and a negative voltage applied during a second time period, and wherein the negative voltage has a magnitude that increases during the second time period.

According to an aspect of the present inventive concept, an apparatus for manufacturing a semiconductor device includes a first bias electrode connected to a lower portion of an electrostatic chuck, the electrostatic chuck configured to receive a semiconductor wafer, the first bias chuck configured to receive first bias power having a pulse signal, a second bias electrode disposed above the electrostatic chuck, the second bias electrode configured to receive second bias power, and an edge ring surrounding the electrostatic chuck, the edge ring configured to receive a ring voltage synchronized with at least one of the first bias power and the second bias power, wherein a period of the ring voltage is divided into a first time period, a second time period, and a third time period, and wherein the ring voltage has a constant positive voltage during the first time period and a gradually increasing negative voltage during the second time period.

According to an aspect of the present inventive concept, an apparatus for manufacturing a semiconductor device includes a bias power supply configured to supply a bias power to an electrode in a semiconductor process chamber, a chuck voltage supply configured to supply an electrostatic chuck voltage to an electrostatic chuck disposed in the semiconductor process chamber, the electrostatic chuck configured to hold a semiconductor wafer, and a ring voltage supply configured to supply a ring voltage to an edge ring surrounding the electrostatic chuck to control a thickness of a plasma sheath region, the ring voltage having a constant positive voltage during a first time period and a gradually increasing negative voltage during a second time period.

According to an aspect of the present inventive concept, a manufacturing method of a semiconductor device includes seating a semiconductor wafer on an electrostatic chuck, inputting first bias power, as a pulse signal, to a first bias electrode disposed above the electrostatic chuck, and inputting second bias power to a second bias electrode connected to a lower portion of the electrostatic chuck, wherein a combination of the first bias power and the second bias power accelerates plasma particles toward the semiconductor wafer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
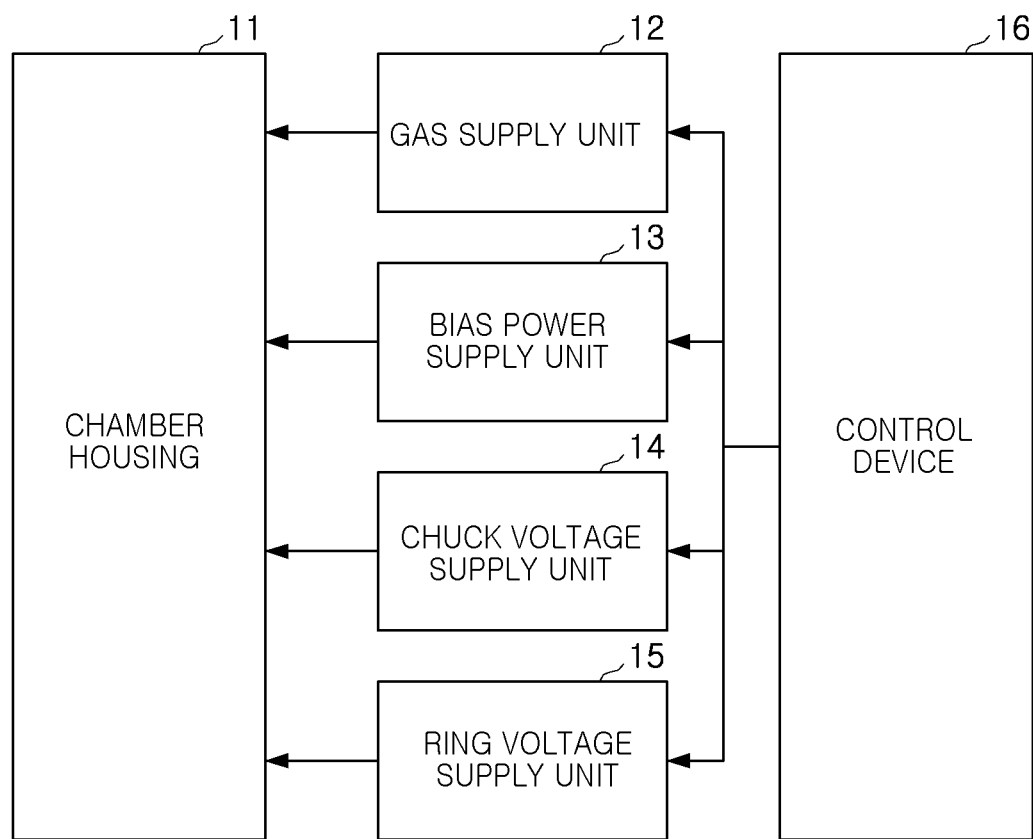
FIGS. 1 and 2 illustrate an apparatus for manufacturing a semiconductor device according to an example embodiment of the present inventive concept.
Figure 2:
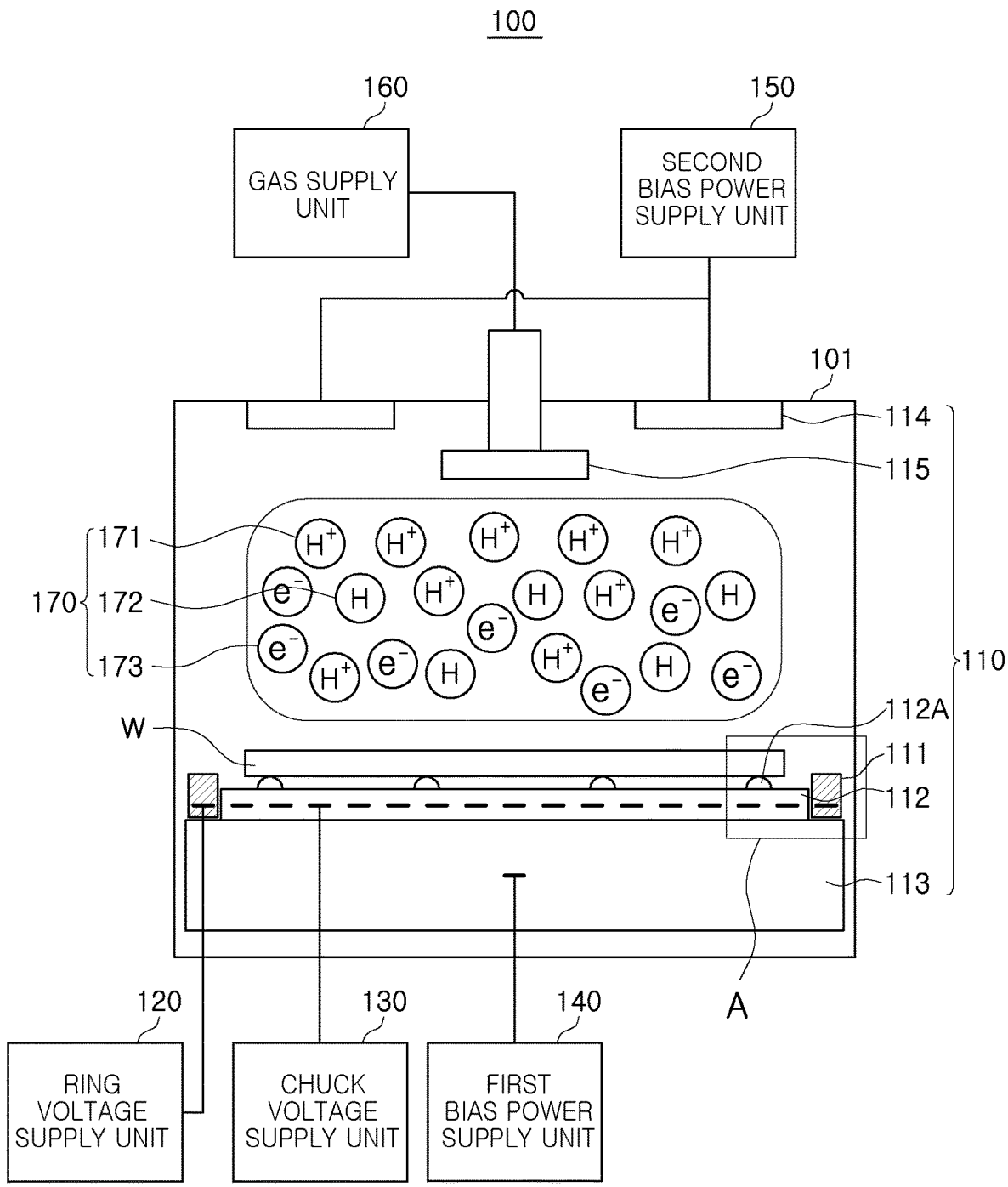

FIGS. 1 and 2 illustrate an apparatus including a semiconductor process chamber according to an example embodiment of the present inventive concept.

Referring to FIG. 1, a plasma processing apparatus 10 according to an example embodiment may include a chamber housing 11, a gas supply unit 12, a bias power supply unit 13, a chuck voltage supply unit 14, a ring voltage supply unit 15, and a control device 16. For example, the gas supply unit 12 may be a gas supply, the bias power supply unit 13 may be a bias power supply, the chuck voltage supply unit 14 may be a chuck voltage supply, the ring voltage supply unit 15 may be a ring voltage supply, and the control device 16 may be a controller. The chamber housing 11 may provide a space in which a semiconductor process is performed. For example, a process manufacturing a semiconductor device may be performed in a chamber enclosed by the chamber housing 11. For example, the semiconductor process may be a process for manufacturing semiconductor devices. The gas supply unit 12, the bias power supply unit 13, the chuck voltage supply unit 14, the ring voltage supply unit 15, and the like may be provided on the chamber housing 11.

The gas supply unit 12 may supply a gas used to perform a semiconductor process in the process chamber enclosed by the chamber housing 11, and the type of gas supplied into the process chamber may vary depending on a type of semiconductor process. The bias power supply unit 13 is a circuit configured to supply bias power used to perform a semiconductor process. In certain embodiments, a plurality of bias power supply units 13 may be included in the apparatus 10. As an example, the plural bias power supply units 13 may be respectively provided at an upper portion and a lower portion of the chamber housing 11. For example, the plurality of bias power supply units 13 may be respectively connected to an upper portion and a lower portion of the chamber. In the case in which a semiconductor process uses plasma, the gas supply unit 12 may supply hydrogen or an inert gas into the chamber, and hydrogen ions, radicals, and the like, e.g., hydrogen plasma and/or an inert gas plasma may be formed by the bias power supplied by the bias power supply units 13.

The chuck voltage supply unit 14 may input a chuck voltage to an electrostatic chuck (ECS) on which a semiconductor wafer, a mother substrate for a display, or the like, may be seated as an object of a semiconductor process. Coulomb force is generated by the chuck voltage, and the semiconductor wafer, the mother substrate for display, or the like may be fixed to the electrostatic chuck by the Coulomb force.

In the plasma processing apparatus 10 according to an example embodiment, an edge ring may be disposed around the electrostatic chuck. The edge ring may be separated from the electrostatic chuck by a predetermined distance to surround a side surface of the electrostatic chuck, e.g., in a plan view. The ring voltage supply unit 15 may supply a predetermined ring voltage to an electrode in the edge ring. A sheath region above the edge ring may have a thickness adjusted by the ring voltage.

The control device 16 may control the gas supply unit 12, the bias power supply unit 13, the chuck voltage supply unit 14, the ring voltage supply unit 15, and the like to perform a semiconductor manufacturing process in the chamber housing 11. As an example, the control device 16 may determine a flow rate of a gas supplied by the gas supply unit 12, bias power applied into the chamber, a chuck voltage input to the electrostatic chuck, the ring voltage input to the edge ring, and the like. In example embodiments, the control device 16 may input a ring voltage of various waveforms, as well as a simple pulse wave, sinusoidal wave or DC voltage, to the edge ring to prevent/reduce degradation of a field distribution, varying depending on consumption of the edge ring, and to improve process efficiency by relieving charge accumulated on the edge ring. For example, the control device 16 may be a controller connected to the ring voltage supply unit 15. The ring voltage supply unit 15 may be a power supply generating a plurality of levels of DC power. For example, the controller 16 may control the plurality of levels of DC power generated by the ring voltage supply 15 to output a series of electric signal, e.g., as shown in FIGS. 8, 9, 11B and 12B. For example, the controller 16 may send control signals to the ring voltage supply 15 to selectively output a series of electric signals having a plurality of divisions having respective voltage levels. Each of the respective voltages may be generated by selecting one of the plurality of levels of DC power or a combination of levels of the DC power. For example, the ring voltage supply 15 may include a switch and/or a modulator to select and/or combine the levels of the DC power. For example, the ring voltage supply 15 may include a positive DC power generator and a negative DC power generator.

Referring to FIG. 2, a semiconductor process apparatus 100 according to an example embodiment may be an apparatus for performing a semiconductor process using plasma. The semiconductor process apparatus 100 may include a chamber 110, a ring voltage supply unit 120, a chuck voltage supply unit 130, a first bias power supply unit 140, a second bias power supply unit 150, a gas supply unit 160, and the like. For example, the semiconductor process apparatus 100 may be an example of the semiconductor process apparatus 10 of FIG. 1, and some elements of the apparatus 10 are not shown in the apparatus 100 and vice versa. Bias powers described in the present disclosure may corresponding bias voltages. For example, the first and second bias powers may have corresponding bias voltages. The ring voltage supply 15 may be configured to supply different waveforms of voltage to the edge ring, and the waveforms may be determined depending on the bias voltages applied to the first bias electrode.

The chamber 110 may include an edge ring 111, an electrostatic chuck 112, a first bias electrode 113, a second bias electrode 114, a gas flow path 115, and the like, which are disposed in a housing 101. A process object to be subject to a semiconductor process may be seated on the electrostatic chuck 112. As an example, the process object may be a semiconductor wafer W. As an example, a plurality of protrusions 112A, each having a pin shape and/or rounding top, may be disposed on a top surface of the electrostatic chuck 112. The semiconductor wafer W may be seated on the protrusions 112A, and there may be a space between a top surface of the electrostatic chuck 112 and a bottom surface of the semiconductor wafer W. As an example, the space between the top surface of the electrostatic chuck 112 and the bottom surface of the semiconductor wafer W may be filled with a helium gas or the like to cool the semiconductor wafer W. In certain embodiments, the top surface of the electrostatic chuck 112 may be flat, and the semiconductor wafer W may contact the top surface of the electrostatic chuck 112. For example, the contact area of the bottom surface of the semiconductor wafer W may be greater than a half of the whole area of the bottom surface of the semiconductor wafer W. In some embodiments, the cooling gas, e.g., helium gas, may contact the bottom surface of the semiconductor wafer W. In certain embodiment, the cooling gas may flow along a hole formed within the electrostatic chuck. In this case, the cooling gas may not contact the semiconductor wafer W.

In example embodiments, the semiconductor wafer W may be fixed to the top surface of the electrostatic chuck 112 by the Coulomb force generated from a chuck voltage supplied to the electrostatic chuck 112 by the chuck voltage supply unit 130. As an example, the chuck voltage supplied by the chuck voltage supply unit 130 may be a constant voltage, and the chuck voltage may have a magnitude of several hundreds of volts to several thousands of volts.

A reactive gas may be introduced through the gas flow path to perform a semiconductor process. The first bias power supply unit 140 may supply first bias power to a first bias electrode 113 disposed below the electrostatic chuck 112, and the second bias power supply unit 150 may supply second bias power to a second bias electrode 114 disposed above the electrostatic chuck 112. Each of the first bias power supply unit 140 and the second bias power supply unit 150 may include a radio-frequency (RF) power source configured to supply bias power.

Plasma 170 containing ions 171, radicals 172, electrons 173, and the like may be generated on the semiconductor wafer W, e.g., between the wafer and the second bias electrode 114, from the reactive gas by the first bias power and the second bias power. The reactive gas may be turned into the plasma 170 by the first and second bias powers to increase reactivity. As an example, in the case in which the semiconductor process apparatus 100 is an etching apparatus, the ions 171, the radicals 172, the electrons 173, and the like of the plasma may be accelerated to the semiconductor wafer W by the first bias power supplied to the first bias electrode 113 by the first bias power supply unit 140. At least some of a semiconductor substrate or layers included in the semiconductor wafer W may be dry etched by the ions 171, the radicals 172, the electrons 173, and the like of the plasma.

A self-bias voltage may be generated on the semiconductor wafer W by the first bias power supplied to the first bias electrode 113 and the second bias power supplied to the second bias electrode 114. In example embodiments, the plasma 170 may be generated on the semiconductor wafer W by the self-bias voltage, and a plasma sheath region may be formed between the plasma 170 and the semiconductor wafer W.

The ions 171, the radicals 172, the electrons 173, and the like contained in the plasma 170 may be incident on the semiconductor wafer W through the plasma sheath region. An angle, at which the ions 171, the radicals 172, the electrons 173, and the like are incident on the semiconductor wafer W, may vary depending on a thickness or the like of the plasma sheath region. As an example, the thickness of the plasma sheath region may be increased or decreased toward the edge ring 111 from a center of the semiconductor wafer W.

As an example, when a thickness of the plasma sheath region above the edge ring 111 is smaller than a thickness of the plasma sheath region above the semiconductor wafer W, an angle at which the ions 171, the radicals 172, the electrons 173, and the like are incident on the semiconductor wafer W, may be distorted at a region adjacent to a boundary of the semiconductor wafer W. For example, flowing direction of particles (e.g., the ions 171, the radicals 172 and/or the electrons 173) at an edge portion of the plasma 170 corresponding to an edge portion of the wafer W and/or corresponding to the edge ring 111 may not parallel with flowing direction of particles at a center portion of the plasma 170 corresponding to a center of the wafer W. The angle at which the ions 171, the radicals 172, the electrons 173, and the like are incident on the semiconductor wafer W, may not be in a right-angle direction to a top surface of the semiconductor wafer. For example, the particles of the plasma 170 may not be incident perpendicularly on the semiconductor wafer W at the edge portion. Hence, a semiconductor process may not be efficiently performed in the region adjacent to the boundary of the semiconductor wafer W. For example, when the particles (e.g., the ions 171, the radicals 172 and/or the electrons 173) of the plasma are incident perpendicularly on the wafer W, etching/deposition process may be performed more effectively than a case when plasma particles are incident on the wafer W in an inclined angle.

To address the above issue, the ring voltage input to the edge ring 111 may be increased in such a manner that the thickness of the plasma sheath region is increased above the edge ring 111. However, as the ring voltage is increased, the edge ring 111 may be electrically charged, and acceleration of the ions 171, the radicals 172, and the like toward the semiconductor wafer W may be reduced or prevented from above the edge ring 111 and or from above the edge portion of the semiconductor wafer W.

In certain examples, when the semiconductor process is an etching process, the edge ring 111 may be also etched from an upper portion thereof as the etching process is performed. Therefore, a thickness of the edge ring 111 may be decreased. In this case, the thickness of the plasma sheath region may also be decreased above the edge ring 111, and the angle at which the ions 171, the radicals 172, the electrons 173, and the like are incident on the semiconductor wafer W, may be distorted. For example, the semiconductor process may not be precisely performed. When the magnitude of the voltage input to the edge ring is increased to compensate for a decrease in thickness of the plasma sheath region caused by etching of the edge ring 111, the above-mentioned issue (e.g., the electrically charged edge ring) may occur.

In example embodiments, the above-mentioned issue may be addressed by variously changing the voltage input to the edge ring 111. The ring voltage supply unit 120 may include a voltage generator configured to output voltages having various waveforms to an electrode included in the edge ring 111. As an example, the ring voltage supply unit 120 may supply a ring voltage having a predetermined period. The ring voltage may have a positive voltage for a first time period and have a negative voltage for a second time period. In example embodiments, the ring voltage supply unit 120 may generate a negative voltage of which magnitude of the negative voltage is gradually increasing, for example, a slope voltage having an absolute value gradually increasing and a negative sign as the ring voltage in the second time period to adjust the thickness of the plasma sheath region above the edge ring 111 and to improve degradation of process efficiency or the like caused by charging of the edge ring 111.

The degree of charge-up, where the edge ring 111 is charged, may depend on a magnitude of the first bias power and a magnitude of the second bias power for generating the plasma 170. In example embodiments, a variation in length of the second time period included in the period of the ring voltage, a variation in the magnitude of the ring voltage in the second time period, and the like may be determined in consideration of at least one of the first bias power and the second bias power. For example, at least a portion of the variation in the magnitude of the ring voltage may be greater than the first bias voltage. For example, an absolute value of at least a portion of the variation in the magnitude of the ring voltage may be greater than an absolute value of the first bias voltage. Accordingly, the charge-up of the edge ring 111 may be efficiently offset, and the ions 171 and the like may be continuously accelerated toward the electrostatic chuck 112 to improve process efficiency.

In example embodiments, each of the first bias power and the second bias power may be generated in the form of a pulse. As an example, the first bias power and the second bias power may be input to the first bias electrode 113 and the second bias electrode 114 after being synchronized with each other. For example, while the first bias power is input to the first bias electrode 113, the second bias power may also be input to the second bias electrode 114. When the first bias power is not input to the first bias electrode 113, the second bias power may also not be input to the second bias electrode 114.

When the ring voltage is input to the edge ring, regardless of waveforms of the first bias power and the second bias power, the ions 171 may be concentrated on the edge ring 111, while the first bias power and the second bias power are not input. The ions 171 concentrated on the edge ring 111 may be discharged toward above the edge ring 111. As a result, the edge ring 111 or a portion of the semiconductor wafer W adjacent to the edge ring 111 may be damaged, and/or wear-out of the edge ring 111 may be accelerated by the discharge. The ions 171 concentrated on the edge ring 111 may distort a particle incident direction from above the edge ring 111 and/or above an edge portion of the wafer W. For example, the ions 171 concentrated on the edge ring 111 may deteriorate the quality of the plasma process.

To address the above issue, in example embodiments, at least one of the first bias power and the second bias power may be synchronized with the ring voltage. For example, while at least one of the first bias power and the second bias power is not input, a ring voltage may be generated such that the ions 171 are not input/incident to the edge ring 111. Thus, wear-out of the edge ring 111 and the damage of the semiconductor wafer W may be reduced to improve process efficiency and stability.

Figure 3:
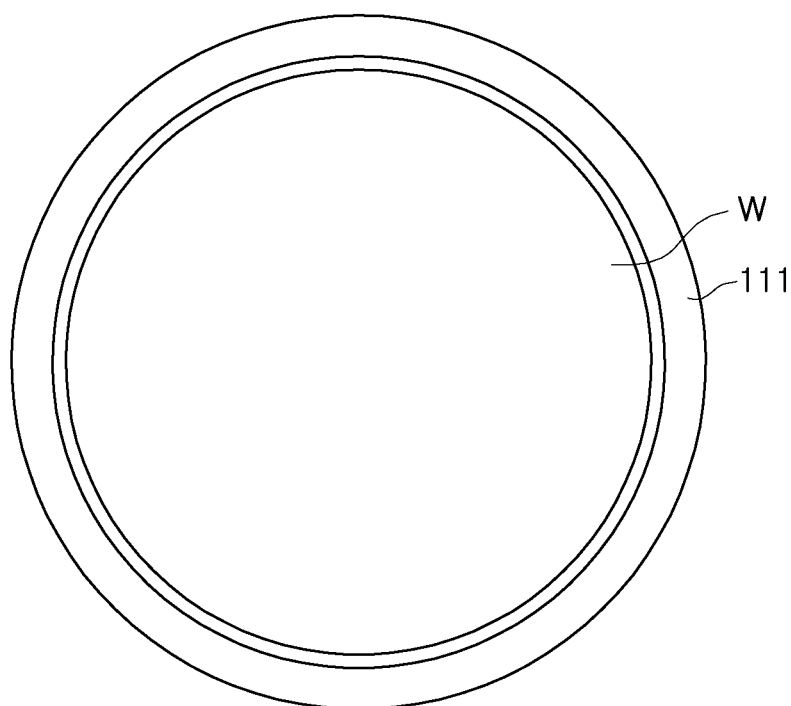
FIG. 3 is an enlarged view of region A in FIG. 2.

FIG. 3 is an enlarged view of region A in FIG. 2.

Referring to FIG. 3, the semiconductor wafer W may be seated on a protrusion 112A formed on a top surface of the electrostatic chuck 112. Accordingly, there may be a space between a bottom surface of the semiconductor wafer W and the top surface of the electrostatic chuck 112. Helium (He) may be introduced into the space to cool the semiconductor wafer W. In the embodiment illustrated in FIG. 3, a plasma sheath region between plasma and the semiconductor wafer W may be omitted. For example, the plasma sheath region may be formed between the plasma and the semiconductor wafer W.

The electrostatic chuck 112 may be disposed on the first bias electrode 113, and an electrode 112E, to which an electrostatic chuck voltage is input, may be provided inside the electrostatic chuck 112. For example, the electrostatic chuck 112 may contact the first vias electrode 113. For example, the electrostatic chuck 112 may include the electrode 112E and an insulation layer surrounding the electrode 112E. As an example, the electrostatic chuck voltage may be a direct current (DC) voltage or a pulse voltage. The edge ring 111 is provided around the electrostatic chuck 112, and a ring electrode 111E may be embedded in the edge ring 111. As set forth above, the edge ring 111 may be formed of a dielectric material. For example, the edge ring 111 may include the ring electrode 111E and a dielectric material surrounding the ring electrode 111E.

To perform a semiconductor process, plasma 170 may be generated above the semiconductor wafer W. Ions 171, radicals 172, electric charges 173, and the like contained in the plasma 170 may be accelerated to the semiconductor wafer W to perform the semiconductor process. A positive potential is formed above the edge ring 111, and the ions 171 may be accelerated to the edge ring 111 while a negative voltage is input to the ring electrode 111E inside the edge ring 111. For example, the ions 171 may be incident on the edge ring 111, and the ions 171 may be accumulated on the edge ring 111 so that the edge ring 111 may be positively charged. Accordingly, the ions 171 may not be accelerated to the edge ring 111 after the edge ring 111 is charged with the ions 171 even while the negative voltage is input to the ring electrode 111E. For example, the ions 171 may be positive ions as shown in FIGS. 2 and 3.

In example embodiments, the ring voltage supply unit 120 may output a ring voltage of various waveforms to the ring electrode 111E in such a manner that the ions 171 may be accelerated toward the edge ring 111 even when the edge ring 111 is positively charged. As an example, the ring voltage may have a waveform of a slope voltage, where an absolute value of the ring voltage is gradually increased, during a time period in which the ring voltage input to the ring electrode 111 has a negative voltage. Accordingly, even when the edge ring 111 is positively charged, the ions 171 may be incident toward the edge ring 111 as the absolute value of the ring voltage is gradually increased. For example, while a negative ring voltage is applied to the edge ring 111, the negative voltage may gradually increase to compensate positive charges gradually accumulated on the edge ring 111 so that negative electric field is maintained toward the plasma sheath and/or the plasma. For example, different values of negative ring voltage may be sequentially applied to the edge ring by sequentially increasing the negative ring voltage.

Figure 4:
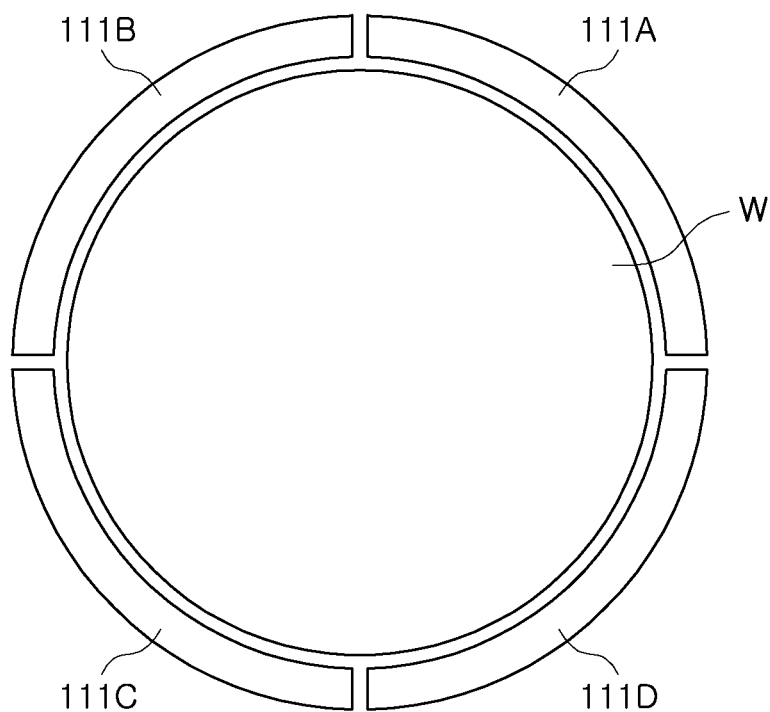
FIGS. 4 and 5 illustrate edge rings included in a semiconductor process chamber according to an example embodiment of the present inventive concept.
Figure 5:
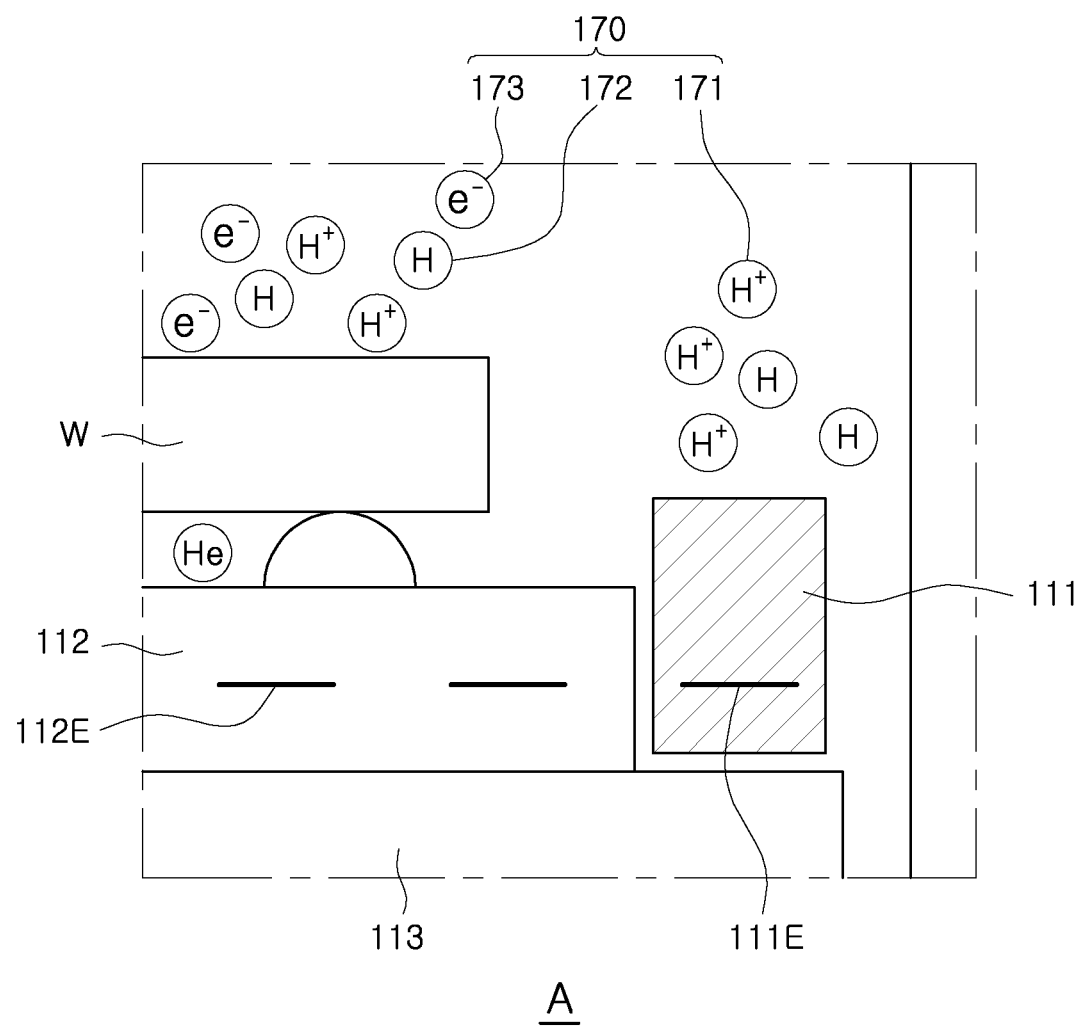

FIGS. 4 and 5 illustrate edge rings which may be included in a semiconductor process chamber according to an example embodiment of the present inventive concept.

Referring to FIG. 4, an edge ring 111 according to an example embodiment may be provided in a semiconductor process chamber to surround a periphery of a semiconductor wafer W. As an example, the edge ring 111 may be disposed around an electrostatic chuck, on which the semiconductor wafer W is seated, and may surround the periphery of the semiconductor wafer W. For example, the edge ring 111 may have a continuous single structure as shown in FIG. 4.

The edge ring 111 may be formed of a dielectric material, and one or more electrodes may be embedded in the edge ring 111. A ring voltage supply unit of a semiconductor process apparatus may input a predetermined ring voltage to an electrode inside the edge ring 111. In some embodiments, a ring voltage of a predetermined waveform such as a DC voltage, a sinusoidal wave, a pulse wave, or the like is input to the edge ring 111. In certain example embodiments, the ring voltage supply unit may generate a ring voltage of various waveforms different from the DC voltage, the sinusoidal wave or the pulse wave, and input the ring voltage to the electrode inside the edge ring 111. When a plurality of electrodes are embedded in the edge ring 111, the plurality of electrodes may receive a ring voltage together from the ring voltage supply unit. For example, the plurality of electrodes embedded in the edge ring 111 may be electrically connected to each other.

Referring to FIG. 5, an edge ring 111 may include a plurality of unit structures 111A to 111D separated from each other. In an embodiment illustrated in FIG. 5, it is assumed that the edge ring 111 includes four unit structures 111A to 111D, but the number of the plurality of structures 111A to 111D may be variously changed.

Each of the plurality of unit structures 111A to 111D may be formed of a dielectric material and may include an electrode therein. The electrodes embedded in the plurality of unit structures 111A to 111D may receive the same ring voltage from the ring voltage supply unit. Thus, a voltage of the same waveform may be input to the plurality of unit structures 111A to 111D separated from each other, and a semiconductor process may be uniformly performed on the semiconductor wafer W.

Plasma may be generated above the semiconductor wafer W while a semiconductor process is performed, and charges, ions, and the like may be accelerated to the semiconductor wafer W by a voltage, applied to an upper portion and a lower portion of the semiconductor wafer W, to perform an etching process or the like. However, there may be a sheath region, in which a plasma potential is reduced, above the edge ring 111 far away from the center of the semiconductor wafer W.

Since a positive potential is generated above the edge ring 111, the edge ring 111 itself may be charged when a negative voltage is input to an electrode inside the edge ring 111. For example, an upper surface of the edge ring 111 may be charged with positive ions coming from the plasma formed above the edge ring 111. If the edge ring is charged, ions and the like may not effectively be accelerated above the edge ring 111 even when the negative voltage is input to the electrode inside the edge ring 111. For example, the positive ions accumulated on the surface of the edge ring 111 may diminish negative electric field coming from the electrode inside the edge ring 111. As a result, a semiconductor process may not efficiently be performed in an edge region of the semiconductor wafer W.

To address the above issue, in the present inventive concept, a slope voltage may be input to the edge ring 111 for a predetermined time. The slope voltage may be a voltage whose absolute value is increased in a negative sign. Accordingly, even when the edge ring 111 itself is charged, ions having positive charge characteristics may be accelerated to the edge ring by the slope voltage, and a semiconductor process may be effectively performed even in the edge region of the semiconductor wafer W. As an example, a ring voltage having a predetermined period may be input to the edge ring 111, and the ring voltage may have a waveform of the slope voltage for a portion of the predetermined period.

Figure 6:
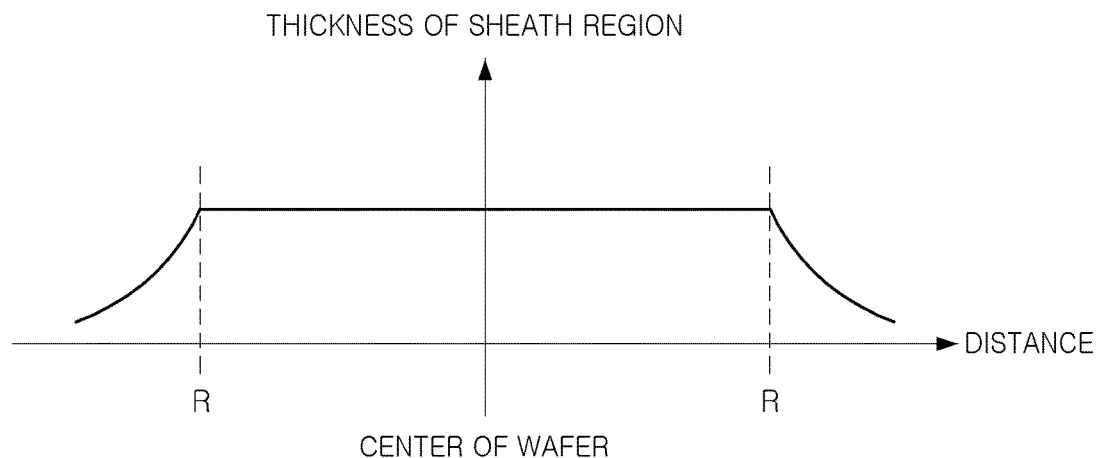
FIGS. 6 and 7 illustrate an operation of a semiconductor process chamber according to an example embodiment of the present inventive concept.
Figure 7:
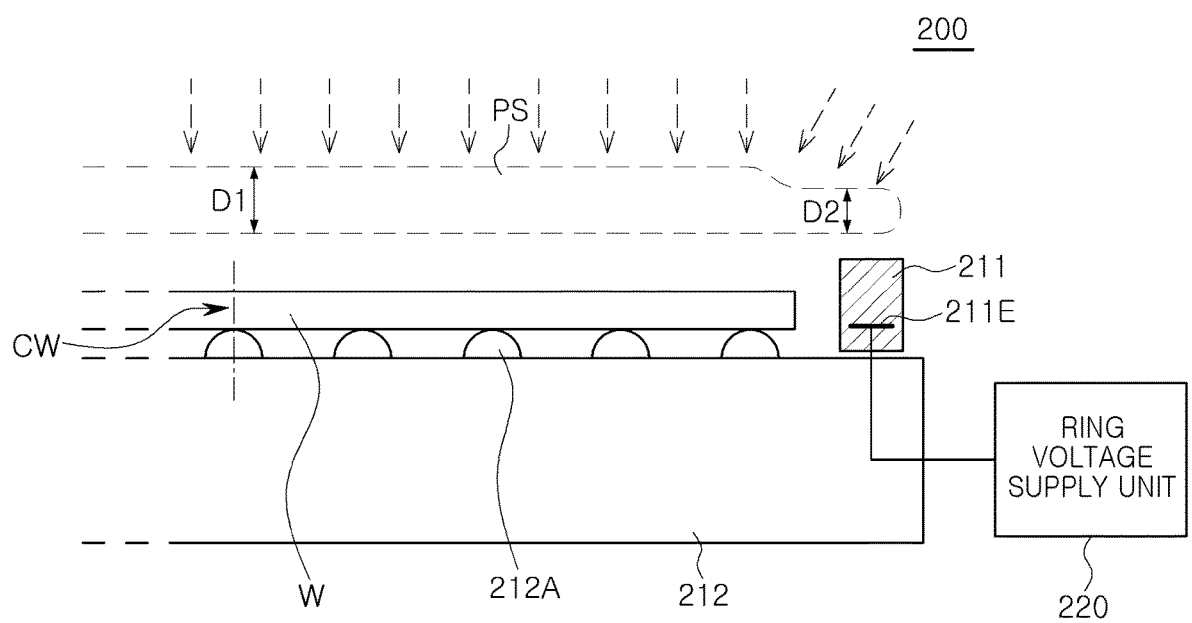

FIGS. 6 and 7 illustrate an operation of a semiconductor process chamber according to an example embodiment of the present inventive concept.

For example, FIG. 6 is a graph illustrating a thickness distribution of a plasma sheath region in a semiconductor process chamber. Referring to FIG. 6, there may be a portion in which a thickness of the plasma sheath region in the semiconductor process chamber is gradually decreased as a distance from a center of a semiconductor wafer becomes longer than a predetermined distance. As an example, a distance R from the center, at which a thickness of the plasma sheath region starts to be decreased, may correspond to a radius of the semiconductor wafer. However, the thickness of the plasma sheath region may be increased in a position farther than a radius of the semiconductor wafer depending on a thickness of the edge ring or the like. When the magnitude of the ring voltage input to the edge ring is increased, the distance R where the thickness of the plasma sheath region decreases may be increased in a position farther than the radius of the semiconductor wafer.

Referring to FIG. 7, a plasma sheath region PS may be formed above a semiconductor wafer W and an edge ring 211 in a semiconductor process chamber 200. The semiconductor wafer W may be seated on a plurality of protrusions 212A disposed on a top surface of an electrostatic chuck 212, and a space between the semiconductor wafer W and a top surface of the electrostatic chuck 212 may be filled with helium or the like for cooling.

The plasma sheath region PS may have a first thickness D1 above the semiconductor wafer W and a second thickness D2 above the edge ring 211. As an example, the first thickness D1 and the second thickness D2 may be different from each other, and the second thickness D2 may vary depending on a ring voltage input to the ring electrode 211E by the ring voltage supply unit 220, a thickness and a height of the edge ring 211, and the like. In the embodiment illustrated in FIG. 7, the second thickness D2 may be less than the first thickness D1. Accordingly, there may be a space in which the thickness of the plasma sheath region PS decreases while a distance get farther from a center CW of the semiconductor wafer W.

The ring voltage input to the edge ring 211 may have a positive voltage during a first time period and a negative voltage during a second time period. When the ring voltage increases, the second thickness D2 of the plasma sheath region PS may increase above the edge ring 211 to improve process efficiency outside the semiconductor wafer W. For example, when the ring voltage increases, electric field above the edge ring 211 and above the edge region of the wafer W may become parallel with electric field formed above a center of the wafer W, and an etching efficiency and/or quality of the plasma process may be improved when the electric field is perpendicular to the top surface of the wafer W. However, when only the magnitude of the ring voltage is increased, charge-up (the edge ring 211 is positively charged during the second time period at which the ring voltage has a negative voltage) may easily occur. For example, the edge ring 211 may be positively charged with the more positive ions 171 when the greater negative voltage is applied to the edge ring 211. Thus, the second thickness D2 of the plasma sheath region PS may not be adjusted above the edge ring 211, or ions may not be accelerated by the ring voltage input to the edge ring to degrade the process efficiency outside the semiconductor wafer W. For example, the plasma process efficiency may be degraded by the positive charges of the positive ions 171 accumulated on the top surface of the edge ring 211 by reducing effective voltage applied to the edge ring 211. As the magnitude of the ring voltage is increased, the second thickness D2 of the plasma sheath region PS may be excessively increased to degrade the process efficiency on an edge region of the semiconductor wafer W.

To address the above issue, in example embodiments, a ring voltage having various waveforms may be input to the edge ring 211 rather than simply increasing the magnitude of the ring voltage. To this end, the ring voltage supply unit 220 may include a voltage generation circuit configured to supply a voltage, a modulator configured to determine a waveform, and the like. For example, the modulator may transform the voltage generated from the voltage generation circuit into a different shape of waveform.

Figure 8:
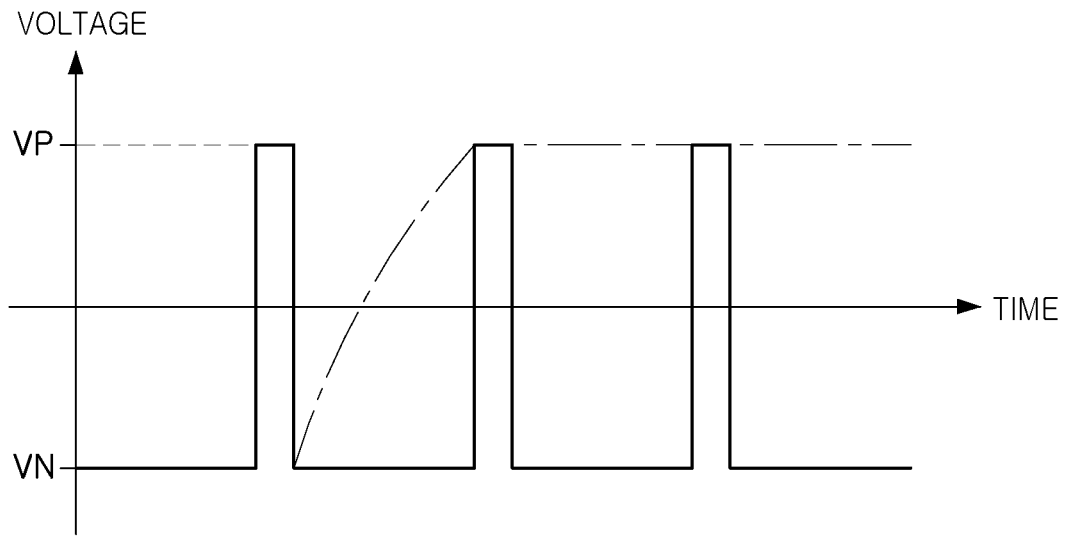
FIGS. 8 and 9 are graphs illustrating an operation of a semiconductor process chamber according to an example embodiment of the present inventive concept.
Figure 9:
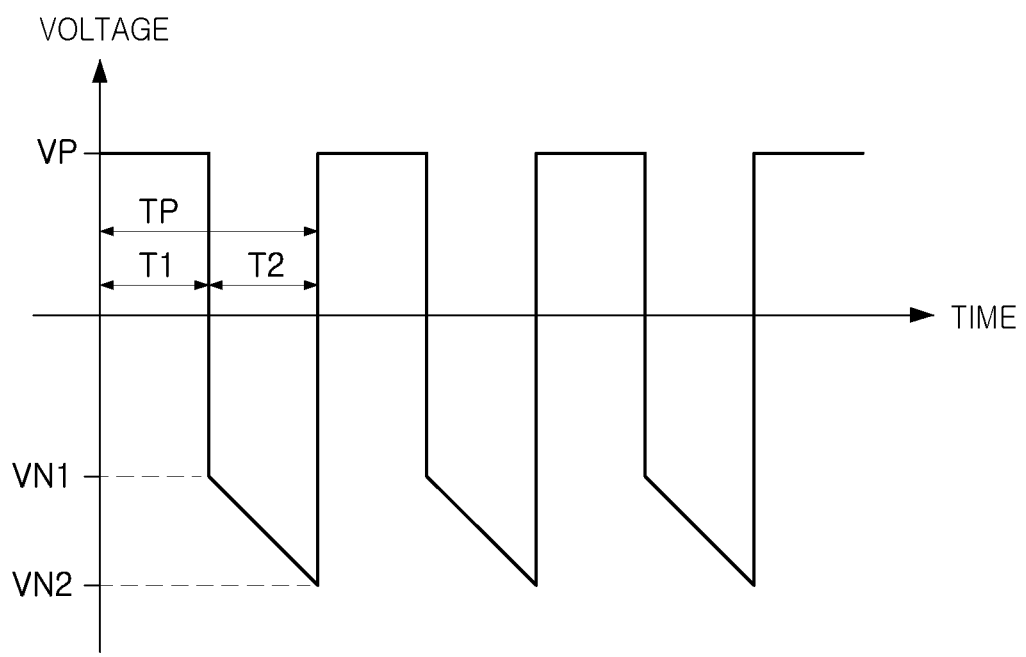

FIGS. 8 and 9 are graphs illustrating an operation of a semiconductor process chamber according to an example embodiment of the present inventive concept.

Referring to FIG. 8, a ring voltage may have a first voltage VP, a positive voltage, and a second voltage VN, a negative voltage, during a single period. For example, the ring voltage may repeat the period including the first voltage VP and the second voltage VN a plurality of times, e.g., while a plasma process is performed. While the ring voltage has the second voltage VN, an edge ring formed of a dielectric material may be electrically charged by a positive potential generated above the edge ring, and a voltage of the edge ring may increase. For example, the edge ring may be positively charged by positive ions accumulated on the edge ring. Accordingly, since the edge ring has a positive voltage even while the ring voltage has the second voltage VN, ions may not be accelerated to a semiconductor wafer at an edge portion of the semiconductor wafer W. For example, etching rate of the process may be lowered by the positive ions accumulated on the edge ring. To address this issue, a voltage having a greater absolute value may be input to the edge ring. For example, a stronger negative voltage than a previous one may be applied to the edge ring to maintain etching rate of the process when the positive ions are accumulated on the edge ring. However, when a strong negative voltage is applied to the edge ring, a slope of the plasma sheath region may be increased in a region, in which the semiconductor wafer and the edge ring are adjacent to each other, and process efficiency may be degraded by the increased slope of the plasma sheath region.

Applying a modified waveform to the edge ring electrode 211E may improve the process efficiency of the plasma chamber. Accordingly, in example embodiments, a voltage having various waveforms may be input to the edge ring, rather than simply inputting a voltage having a greater absolute value to the edge ring. Referring to FIG. 9, in example embodiments, a ring voltage may have a predetermined period TP. The period TP may be divided into a first time period T1 and a second time period T2. In the period TP, a ratio of the first time period T1 and the second time period T2 may vary depending on example embodiments. The ring voltage may have a first voltage VP, a positive voltage, during the first time period T1.

A slope voltage, decreased from a first negative voltage VN1 to a second negative voltage VN2, may be input to the edge ring during the second time period T2 of the period TP. During the second time period T2, the ring voltage may have a trend of gradually increasing negative voltage with time, which also means that the ring voltage has an absolute value gradually increased in a negative sign. For example, the ring voltage supply 220 may apply the first positive voltage VP to the edge ring electrode 211E during the first time period T1, and the first negative voltage VN1 to the edge ring electrode 211E at the starting time of the second time period T2. The controller 16 may control the ring voltage supply 220 to output a series of different levels of negative voltage gradually/continuously increasing levels of negative voltage through the second time period T2 so that the negative voltage level reaches to the second negative voltage VN2 at the end of the second time period T2 as shown in FIG. 9. For example, the gradually/continuously increasing negative voltage level of the ring voltage may increase linearly as shown in FIG. 9. For example, three or more voltage levels may be applied to the edge ring electrode 211E during the second time period T2. For example, the magnitude of the negative voltages may increase in an arithmetic progression as shown in FIG. 9. For example, a graph representing the increasing negative voltage level may have a substantially constant slope/gradient as shown in FIG. 9. For example, the electric signal applied to the edge ring electrode 211E may have a non-sinusoidal periodic waveform includes a pulse portion (positive voltage pulse) and trapezoidal portion as shown in FIG. 9. For example, the difference between the first negative voltage VN1 and the second negative voltage VN2 may be about a half of the first negative voltage VN1. For example, the difference between the first negative voltage VN1 and the second negative voltage VN2 may be between 25% and 70% of the magnitude of the first negative voltage VN1.

Since the ring voltage is decreased from the first negative voltage VN1 to the second negative voltage VN2 in the second time period T2, ions may be accelerated even when the edge ring is electrically charged. As an example, a difference between the first negative voltage VN1 and the second negative voltage VN2 may be determined in consideration of a voltage corresponding to electric charges accumulated in the edge ring. In the embodiment illustrated in FIG. 9, the difference between the first negative voltage VN1 and the second negative voltage VN2 is shown as being the same every second time period T2 of each period TP. However, in some embodiments, the difference between the first negative voltage VN1 and the second negative voltage VN2 may vary in every period TP. For example, at least one of the first negative voltage VN1 and the second negative voltage VN2 may be changed. In certain embodiments, a decreasing trend/slope of the ring voltage may vary in the second time T2 every period TP2.

Figure 10:
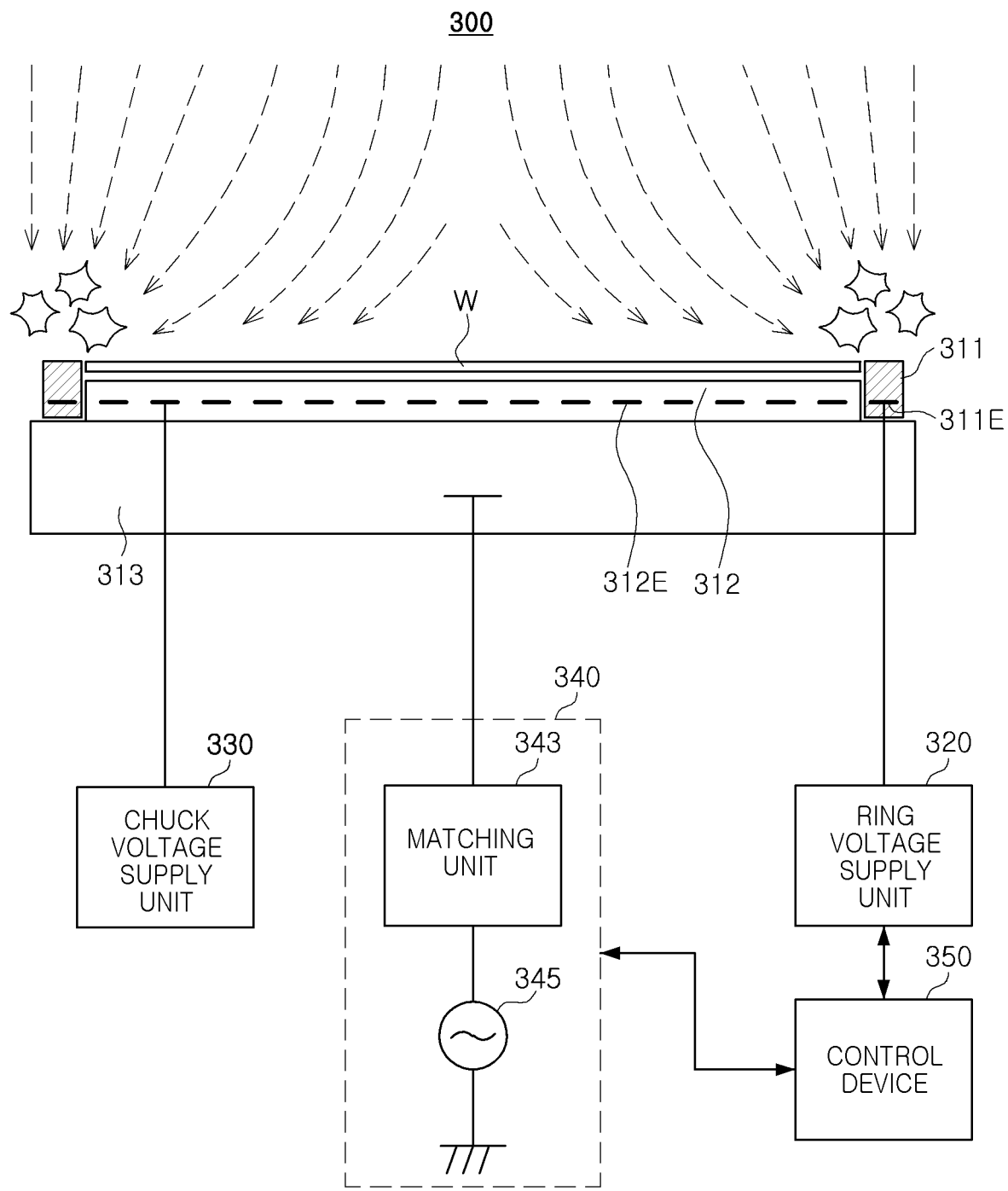
FIG. 10 illustrates a semiconductor process chamber according to an example embodiment of the present inventive concept.

FIG. 10 illustrates a semiconductor process chamber according to an example embodiment of the present inventive concept.

Referring to FIG. 10, in a semiconductor process chamber 300 according to an example embodiment, a chuck voltage supply unit 330 may input an electrostatic chuck voltage to an electrode 312E of an electrostatic chuck 312. Coulomb force is generated between the electrostatic chuck 312 and a semiconductor wafer W by the electrostatic chuck voltage, and the semiconductor wafer W is fixed to the electrostatic chuck 312 by the Coulomb force.

A ring voltage supply unit 320 may input a ring voltage to an edge ring electrode 311E inside an edge ring 311 disposed around the electrostatic chuck 312. The ring voltage is a voltage having a predetermined period, and may input a ring voltage of various waveforms to the electrode edge ring 311E of the edge ring 311 while a plasma process is performed in the plasma chamber.

A first bias electrode 313 may be disposed below the electrostatic chuck 312. The first bias electrode 313 may be a susceptor, and may be used as a bottom electrode to generate plasma. A first bias power supply unit 340 may input first bias power to the first bias electrode 313. As an example, the first bias power may input the first bias power to the first bias electrode 313 in the form of a pulse. For example, the first bias power supply unit 340 may repeatedly perform operations to input and block the first bias power in a predetermined period.

While the first bias power generated in the form of a pulse is blocked, for example, the first bias power is not input to the first bias electrode 340, ions contained in plasma above the electrostatic chuck 312 may be concentrated on the edge ring 311 by the ring voltage input to the edge ring electrode 311E of the edge ring 311. The ions concentrated on the edge ring 311 may cause discharge above the edge ring 311 and may damage the edge ring 311 or a portion of a semiconductor wafer W adjacent to the edge ring 311.

In example embodiments, to address the above issue, the ring voltage input to the edge ring electrode 311E of the edge ring 311 and the first bias power input to the first bias electrode 313 may be synchronized with each other. The synchronization of the first bias power and the ring voltage may be performed in various manners, which will be described below with reference to FIGS. 11A, 11B, 12A and 12B.

FIGS. 11A, 11B, 12A and 12B are graphs illustrating bias power and a ring voltage input to a semiconductor process chamber.

Figure 11A:
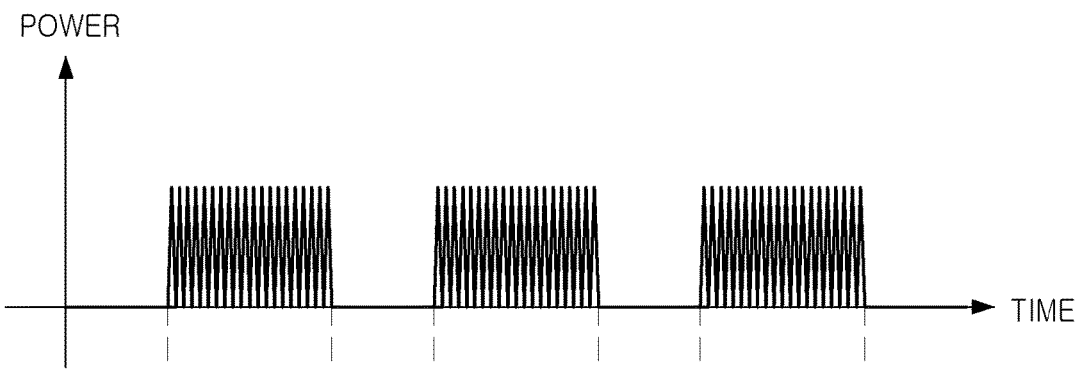
FIGS. 11A, 11B, 12A and 12B are graphs respectively illustrating bias power and a ring voltage input to a semiconductor process chamber.
Figure 11B:
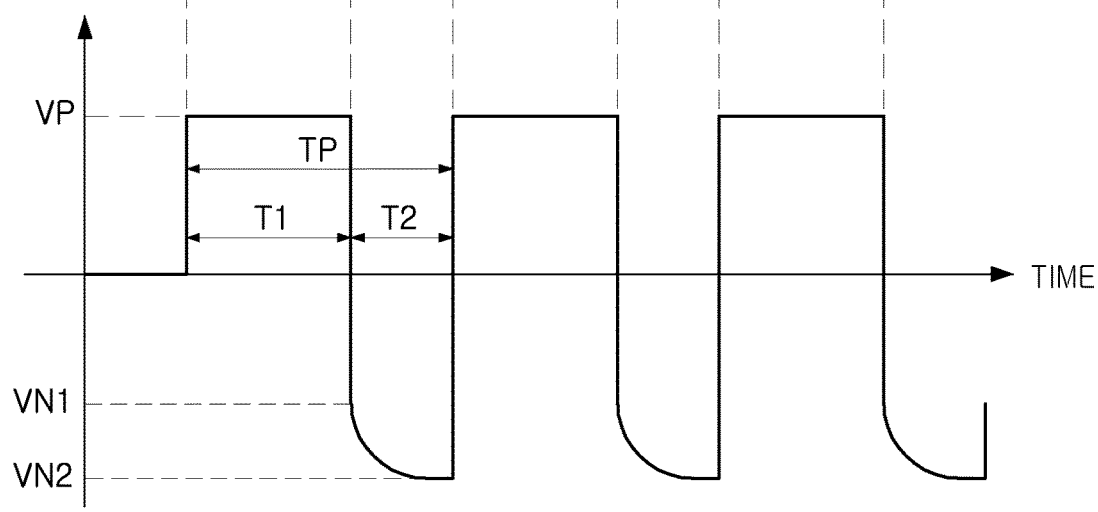

Referring to FIG. 11A, a first bias power may be input to the first bias electrode 313 in the form of a pulse. Referring to FIG. 11B, a ring voltage input to the edge ring electrode 311E of the edge ring 311 may be synchronized with the first bias power. As illustrated in FIG. 11B, the ring voltage may be a voltage having a predetermined period, and a period TP of the ring voltage may be the same as a period the bias power.

The period TP of the ring voltage may be divided into a first time period T1 and a second time period T2. The ring voltage may have a positive voltage VP in the first time period T1 and a negative voltage having a trend/slope of decreasing from a first negative voltage VN1 to a second negative voltage VN2 for the second time period T2. For example, the negative voltage may increase during the second time period T2 as shown in FIG. 11B. For example, the ring voltage supply 320 may apply the positive voltage VP to the edge ring electrode 311E during the first time period T1, and the first negative voltage VN1 to the edge ring electrode 311E at the starting time of the second time period T2. The controller 16 may control the ring voltage supply 320 to output a series of different levels of negative voltage gradually/continuously increasing negative voltage levels through the second time period T2 so that the negative voltage level reaches to VN2 at the end of the second time period T2 as shown in FIG. 11B. For example, the gradually/continuously increasing negative voltage level of the ring voltage may increase with a curved shape as shown in FIG. 11B. For example, a slope of a graph representing the increasing negative voltage level may gradually/continuously increase as shown in FIG. 11B. For example, three or more voltage levels different from one another may be applied to the edge ring electrode 311E during the second time period T2. For example, the electric signal applied to the edge ring electrode 311E may have a non-sinusoidal periodic waveform including a pulse portion (positive voltage pulse) and a generally trapezoidal portion as shown in FIG. 11B (e.g., except top of trapezoid is not linear, but does have a continuous increase in magnitude from VN1 to VN2). However, a waveform of the ring voltage is not limited to the waveform shown in FIG. 11B, and may be variously modified. For example, the difference between the first negative voltage VN1 and the second negative voltage VN2 may be about a half of the first negative voltage VN1. For example, the difference between the first negative voltage VN1 and the second negative voltage VN2 may be between 25% and 70% of the magnitude of the first negative voltage VN1. In the example embodiment illustrated in FIGS. 11A and 11B, the ring voltage may be synchronized to have a negative voltage while the bias power is not input/applied. In some embodiments, the ring voltage may be synchronized to have a positive voltage while a bias power is not input. For example, the bias power and the ring voltage may be synchronized at various phase differences.

Figure 12A:
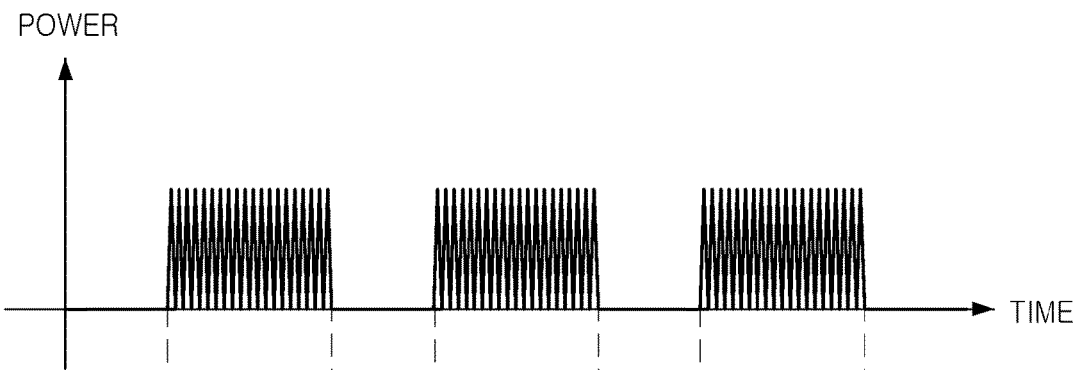
Figure 12B:
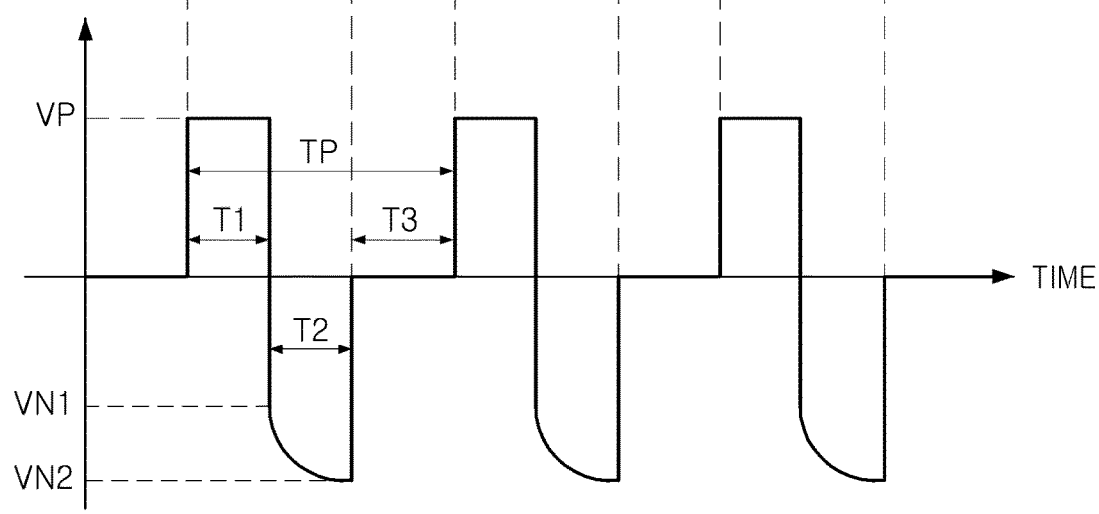

Referring to FIG. 12A, first bias power may be input to the first bias electrode 313 in the form of a pulse. Referring to FIG. 12B, a period TP of a ring voltage input to the edge ring 311 may be divided into a first time period T1, a second time period T2, and a third time period T3. The ring voltage may have a positive voltage VP in the first time period T1 and a voltage having a trend/slope of decreasing from a first negative voltage VN1 to a second negative voltage VN2 in the second time period T2. For example, the negative voltage applied to the edge ring 311 during the second time period T2 may be the same as the corresponding one described with respect to FIG. 11B. In the embodiment illustrated in FIG. 12B, the ring voltage may not be input to the electrode 311E of the edge ring 311 for the third time period T3. In certain embodiments, a DC voltage lesser than the positive voltage VP and the first and second negative voltages VN1 and VN2 may be applied to the edge ring 311 during the third time period T3. For example, the electric signal applied to the edge ring electrode 311E may have a non-sinusoidal periodic waveform including a pulse portion (positive voltage pulse), a generally trapezoidal portion as shown in FIG. 12B (e.g., except that a top of trapezoid is not linear, but does have a continuous increase in magnitude from VN1 to VN2) and a blank portion without substantial electrical signal.

As an example, the third time period T3 may correspond to a time at which the first bias power is not input to the first bias electrode 313. For example, the ring voltage may be synchronized with the first bias power having the form of a pulse. The ring voltage may not be input to the edge ring 311 while the first bias power is not input. Accordingly, ions, radicals, and the like may not be concentrated on the edge ring 311 while the ring voltage is not applied to the edge ring 311, which may reduce unwanted discharge occurring from above the edge ring 311.

The first bias power may be synchronized with the second bias power input to the second bias electrode provided at an upper portion of the semiconductor process chamber. For example, the second bias power may be input/applied while the first bias power is input/applied, and the second bias power may not be input/applied while the first bias power is not input/applied. For example, the ring voltage may be synchronized with the first bias power and the second bias power may be generated in the form of a pulse. In certain embodiments, when the first bias power is not applied to the first bias electrode, a ground voltage may be applied to the edge ring electrode.

Figure 13:
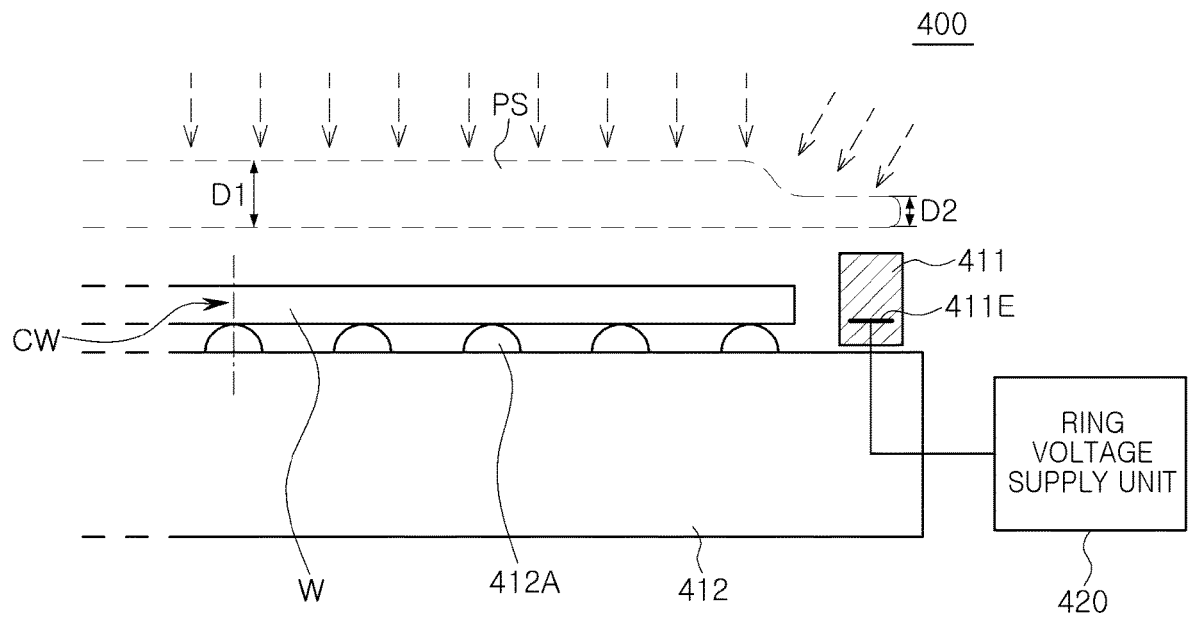
FIGS. 13 to 15 illustrate an operation of a semiconductor process chamber according to an example embodiment of the present inventive concept.
Figure 14:
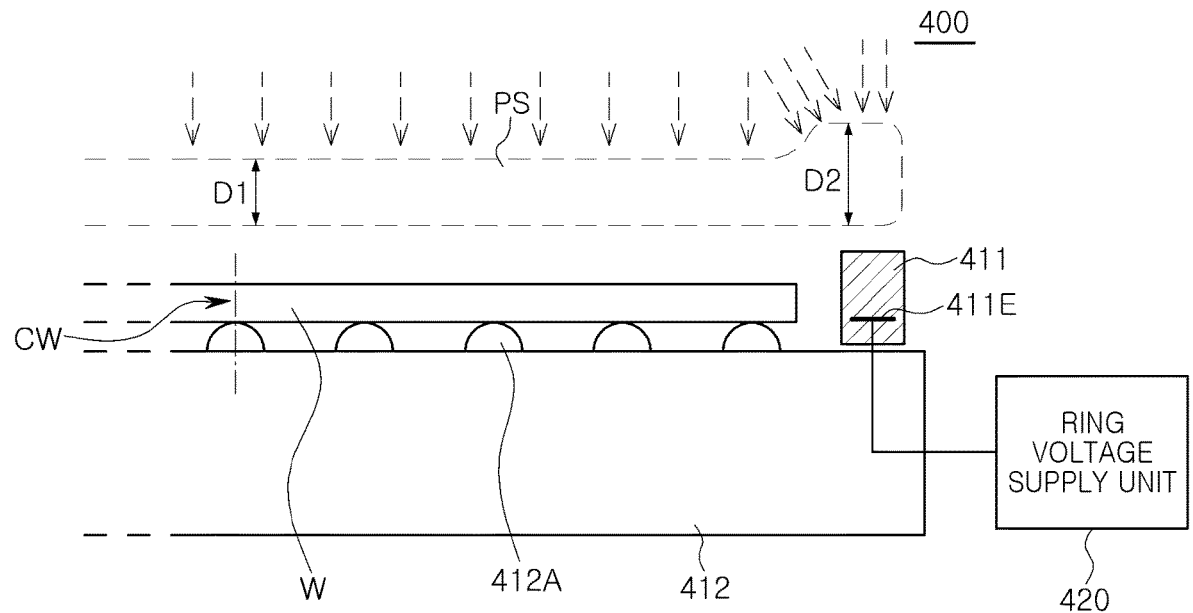
Figure 15:
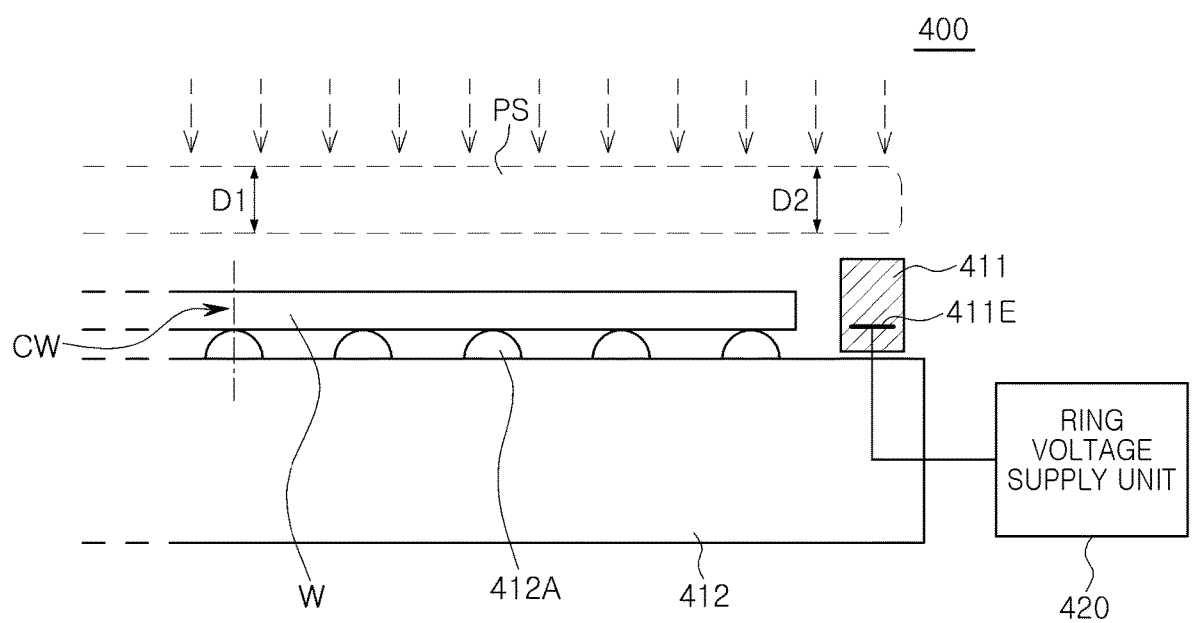

FIGS. 13 to 15 illustrate an operation of a semiconductor process chamber according to an example embodiment of the present inventive concept.

Referring to FIGS. 13 to 15, a semiconductor process chamber 400 according to an example embodiment may include an electrostatic chuck 412 on which a semiconductor wafer W is seated, an edge ring 411 disposed around the electrostatic chuck 412 to surround the semiconductor wafer W, and a ring voltage supply unit 420 configured to input a ring voltage to an electrode 411E of the edge ring 411. As an example, the semiconductor wafer W may be provided on a plurality of protrusions 412A formed on a top surface of the electrostatic chuck 412.

A plasma sheath region PS may be formed on top surfaces of the semiconductor wafer W and the edge ring 411. A thickness of the plasma sheath region PS above the semiconductor wafer W may be different from a thickness of the plasma sheath region PS above the edge ring 411. The thickness of the plasma sheath region PS above the edge ring 411 may vary due to the ring voltage input to the edge ring 411 by the ring voltage supply unit 420. As an example, the plasma sheath region PS may have a first thickness D1 above the semiconductor wafer W and a second thickness D2 above the edge ring 411. When the ring voltage is relatively small, the second thickness D2 may be less than the first thickness D1. Accordingly, as illustrated in FIG. 13, an incident direction of ions, radicals, and the like may be distorted/shifted from a vertical direction in a region above an edge and outside of the semiconductor wafer W.

When the ring voltage is relatively large, the second thickness D2 may be greater than the first thickness D1, as illustrated in FIG. 14. By inputting a relatively greater ring voltage and appropriately determining a distance between the semiconductor wafer W and the edge ring 411, ions and radicals may be controlled to be vertically incident on an edge area of the semiconductor wafer W. However, when the ring voltage is increased, the edge ring 411 is electrically charged, and thus, the ions, the radicals, and the like may not be accelerated any more, e.g., after the edge ring 411 is positively charged. When the ring voltage is decreased to address the issue, acceleration directions of the ions, the radical, and the like may be distorted from a vertical direction in the region above the edge and outside of the semiconductor wafer W, as illustrated in FIG. 13.

Accordingly, in example embodiments, the ring voltage supply unit 420 may input a ring voltage of various waveforms to the edge ring 411. The ring voltage supply unit 420 may include a circuitry configured to adjust the magnitude as well as a waveform of the ring voltage. Thus, a difference between the first thickness D1 and the second thickness D2 in the plasma sheath region PS may be significantly reduced, and ions and radicals may be controlled to be uniformly incident in the entire region of the semiconductor wafer W, as illustrated in FIG. 15.

As an example, the ring voltage supply unit 420 may input a ring voltage having a predetermined period to the edge ring 411. The ring voltage has a positive voltage for a first time of a period, and has a negative voltage having a decreasing trend for a second time. Accordingly, an absolute value of the ring voltage is not increased to reduce the difference between the second thickness D2 and the first thickness D1 and to input the negative voltage having a decreasing trend in the second time. As a result, the ions may be accelerated even when the edge ring 411 is electrically charged.

According to example embodiments, a positive voltage is input to an edge ring of a semiconductor process chamber, in which a semiconductor process using plasma is performed, for a first time of a period and a negative voltage is input to the edge ring for a second period of time. A slope voltage input in the second time may have an absolute value gradually increased. Accordingly, even when the edge ring is electrically charged, ions or the like may be accelerated to a wafer to effectively perform a semiconductor process.

Hereinafter, a method of manufacturing a semiconductor device according to an embodiment of the present disclosure will be described.

According to the method of manufacturing a semiconductor device, a substrate may be provided on the electrostatic chuck 112 in the plasma chamber 110. The substrate may be a semiconductor wafer W or another substrate, for example, a crystalline silicon substrate, a crystalline germanium substrate or a crystalline silicon-germanium substrate. Various semiconductor patterns and various conductor patterns may be formed on the substrate to form circuits including transistors, capacitors and/or switches via a plurality of manufacturing processes including multiple steps of photolithography processes before the substrate is provided in the plasma chamber 110. Within the plasma chamber 110, a thin film layer formed on the substrate may be etched by using a plasma etching process. An etching mask pattern may be formed on the thin film layer, and the etching mask pattern may be maintained while the thin film is etched in the plasma chamber. In certain embodiments, the etching mask pattern may be etched out while the thin film is etched to form a pattern. The thin film may be an insulator film or a conductor film. While the thin film is etched in the chamber 110, the edge ring and the bias electrodes may be supplied with electric signals described in an embodiment of the present disclosure. After performing the etching process, one or more layers and/or patterns may be formed on the thin film layer to form additional patterns and/or circuits on the substrate. The resulting substrate may be diced and packaged to form semiconductor devices.

While the disclosure describes similar elements of the apparatus with different notations, the corresponding elements and/or device may indicate the same elements and/or device. For example, the semiconductor processing apparatuses 10 and 100 may represent the same apparatus, the edge rings 111, 211, 311 and 411 may represent the same edge ring, the electrostatic chucks 112, 212, 312 and 412 may represent the same electrostatic chuck, the bias electrodes 113 and 313 may represent the same bias electrode, and the ring voltage supplies 15, 120, 220, 320 and 420 may represent the same ring voltage supply.

While example embodiments have been shown and described above, it will be apparent to those skilled in the art that modifications and variations could be made without departing from the scope of the present inventive concept as defined by the appended claims.

What is claimed is:

1. A semiconductor processing apparatus comprising:
   a chamber housing;
   an electrostatic chuck disposed in the chamber housing, the electrostatic chuck being configured to hold a semiconductor wafer;
   an edge ring surrounding the electrostatic chuck, the edge ring including a ring electrode disposed within the edge ring; and
   a ring voltage supply configured to supply a ring voltage to the ring electrode, the ring voltage having a non-sinusoidal periodic waveform,
   wherein each period of the non-sinusoidal periodic waveform comprises a positive voltage applied during a first time period and a negative voltage applied during a second time period, and
   wherein the negative voltage has a magnitude that increases during the second time period.

2. The semiconductor processing apparatus of claim 1, further comprising:
   a first bias electrode connected to a lower portion of the electrostatic chuck; and
   a first bias power supply configured to supply first bias power to the first bias electrode, the first bias power being synchronized with the ring voltage.

3. The semiconductor processing apparatus of claim 2, wherein the increasing negative ring voltage during the second time period is greater than a magnitude of a bias voltage of the first bias power.

4. The semiconductor processing apparatus of claim 1, wherein the edge ring includes a dielectric material in which the ring electrode is embedded.

5. The semiconductor processing apparatus of claim 1, wherein the edge ring is provided as a continuous single structure surrounding the electrostatic chuck.

6. The semiconductor processing apparatus of claim 1, wherein the edge ring includes a plurality of unit structures separated from each other, and
   wherein the plurality of unit structures of the edge ring surrounds the electrostatic chuck.

7. The semiconductor processing apparatus of claim 6, wherein the plurality of unit structures of the ring includes a plurality of ring electrodes respectively.

8. The semiconductor processing apparatus of claim 7, wherein the plurality of ring electrodes are electrically connected to each other.

9. The semiconductor processing apparatus of claim 1, further comprising:
a second bias electrode installed above the electrostatic chuck; and
a second bias power supply configured to supply second bias power to the second bias electrode,
wherein at least a portion of a difference between the increasing negative ring voltage and a magnitude of a second bias voltage of the second bias power is greater than a difference between the second bias voltage and a first bias voltage of a first bias power during the second time period.

10. The semiconductor processing apparatus of claim 1, wherein the ring voltage supply is configured to adjust a length of the first time period and a length of the second time period within the period.

11. The semiconductor processing apparatus of claim 1, further comprising:
a chuck voltage supply configured to input an electrostatic chuck voltage to an electrode disposed within the electrostatic chuck.

12. The semiconductor processing apparatus of claim 1, wherein the edge ring is separated from the electrostatic chuck by a predetermined distance in a plan view.

13. An apparatus for manufacturing a semiconductor device, the apparatus comprising:
a first bias electrode connected to a lower portion of an electrostatic chuck, the electrostatic chuck configured to receive a semiconductor wafer, the first bias electrode configured to receive first bias power having a pulse signal;
a second bias electrode disposed above the electrostatic chuck, the second bias electrode configured to receive second bias power; and
an edge ring surrounding the electrostatic chuck, the edge ring configured to receive a ring voltage synchronized with at least one of the first bias power and the second bias power,
wherein a period of the ring voltage is divided into a first time period, a second time period, and a third time period, and
wherein the ring voltage has a constant positive voltage during the first time period and a gradually increasing negative voltage during the second time period.

14. The apparatus of claim 13, wherein the edge ring is configured to receive a ground voltage during the third time period.

15. The apparatus of claim 13, wherein the second bias power is generated as a pulse signal synchronized with the first bias power, and
wherein the ring voltage is synchronized with the first bias power and the second bias power.

16. The apparatus of claim 15, wherein the first bias power and the second bias power are input to the first bias electrode and the second bias electrode during the first time period and the second time period, and are not input to the first bias electrode and the second bias electrode during the third time period.

17. The apparatus of claim 13, wherein an absolute value of the ring voltage increases during the second time period.

18. An apparatus for manufacturing a semiconductor device, the apparatus comprising:
a bias power supply configured to supply a bias power to an electrode disposed in a semiconductor process chamber;
a chuck voltage supply configured to supply an electrostatic chuck voltage to an electrostatic chuck disposed in the semiconductor process chamber, the electrostatic chuck configured to hold a semiconductor wafer; and
a ring voltage supply configured to supply a ring voltage to an edge ring surrounding the electrostatic chuck to control a thickness of a plasma sheath region, the ring voltage having a constant positive voltage during a first time period of the ring voltage and a gradually increasing negative voltage during a second time period of the ring voltage.

19. The apparatus of claim 18, wherein the ring voltage supply is configured to supply a plurality of different values of negative ring voltages to the edge ring during the second time period.

20. The apparatus of claim 18, wherein the ring voltage supply is configured to supply different waveforms of the gradually increasing negative voltage depending on the bias power.

* * * * *